(12) United States Patent
Sridhar et al.

(10) Patent No.: US 7,888,196 B2
(45) Date of Patent: Feb. 15, 2011

(54) TRENCH ISOLATION COMPRISING PROCESS HAVING MULTIPLE GATE DIELECTRIC THICKNESSES AND INTEGRATED CIRCUITS THEREFROM

(75) Inventors: Seetharaman Sridhar, Richardson, TX (US); Sameer Pendharkar, Allen, TX (US); Dan M. Mosher, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 12/345,072

(22) Filed: Dec. 29, 2008

(65) Prior Publication Data

US 2010/0163998 A1    Jul. 1, 2010

(51) Int. Cl.
*H01L 21/8238* (2006.01)
(52) U.S. Cl. .............. 438/199; 438/257; 438/424; 257/288; 257/510
(58) Field of Classification Search .......... 438/199, 438/275, 424, 717; 257/288, 510, E21.679
See application file for complete search history.

(56) References Cited

U.S. PATENT DOCUMENTS

| 7,385,274 | B2 * | 6/2008 | Lee et al. | 257/501 |
|---|---|---|---|---|
| 7,410,874 | B2 | 8/2008 | Verma et al. | |
| 7,534,684 | B2 * | 5/2009 | Lee et al. | 438/275 |
| 2005/0127473 | A1 * | 6/2005 | Sakagami | 257/510 |
| 2007/0049050 | A1 * | 3/2007 | Kakoschke et al. | 438/776 |

* cited by examiner

*Primary Examiner*—Phuc T Dang
(74) *Attorney, Agent, or Firm*—Warren L. Franz; Wade J. Brady, III; Frederick J. Telecky, Jr.

(57) ABSTRACT

A method of fabricating an integrated circuit (IC) including a first plurality of MOS transistors having a first gate dielectric having a first thickness in first regions, and a second plurality of MOS transistors having a second gate dielectric having a second thickness in second regions, wherein the first thickness<the second thickness. A substrate having a semiconducting surface is provided. A pad dielectric layer having a thickness≦the second thickness is formed on the semiconductor surface including over the second regions, wherein the pad dielectric layer provides at least a portion of the second thickness for the second gate dielectric. A hard mask layer is formed on the semiconductor surface including over the second regions. A plurality of trench isolation regions are formed by etching through the pad dielectric layer and a portion of the semiconductor surface. The plurality of trench isolation regions are filled with a dielectric fill material to form trench isolation regions, and the hard mask layer is then removed. A patterned gate electrode layer is formed over the second gate dielectric, wherein said patterned gate electrode layer extends over a surface of at least one of the trench isolation regions. Fabrication of the MOS transistors in the first and second regions is then completed.

14 Claims, 5 Drawing Sheets

TRENCH ISOLATION COMPRISING PROCESS HAVING MULTIPLE GATE DIELECTRIC THICKNESSES AND INTEGRATED CIRCUITS THEREFROM

FIELD OF THE INVENTION

Embodiments of the present invention relate to methods of manufacturing integrated circuits (ICs) and in particular to methods of manufacturing Metal Oxide Semiconductor (MOS) field effect transistors (FETs) having trench isolation and two or more different gate dielectric thicknesses on the same IC, and ICs therefrom.

BACKGROUND

It has become increasingly common to integrate devices with different characteristics on a single IC. The different types of devices have different operating and breakdown voltages thus requiring multiple gate dielectric layers (e.g. oxide layers) having different thicknesses to be formed. For example, the IC may have low, medium and high voltage device regions with the gate dielectric associated with the FET in the high voltage region being the thickest, the gate dielectric associated with the FETs in the low voltage device region being the thinnest, and the gate dielectric associated with the medium voltage device region being somewhere between the thinnest and the thickest. ICs having FETs formed as such are referred to as triple gate oxide (TGO) chips, and are referred to more generally as triple gate dielectric (TGD) chips.

In order to form two or more different gate dielectric thicknesses in the respective device regions of an IC, several dielectric removal and deposition or growth steps are generally necessary. However, when integrated into a trench isolation process comprising flow, as described below, the dielectric removal processes generally have a detrimental impact on the trench isolation comprising structures which are commonly used for electrical isolation between adjacent FETs and between certain regions of individual FETs.

As used herein, the term "trench isolation" applies for both conventional (e.g. bulk Si) substrates as well as silicon on insulator (SOI) substrates. Applied to conventional substrates, as used herein the term trench isolation includes deep trench isolation which is typically 1-5 µm deep, and shallow trench isolation which is typically <1 µm deep, such as 0.3 to 0.7 µm deep. Applied to SOI substrates, as used herein, trench isolation includes the isolation regions between the active area islands. In the case of thin film SOI, the trench isolation regions like in the conventional substrate case are generally filled with a deposited dielectric, but are typically shallower that their conventional substrate counterparts, being generally <0.5 µm deep, such as 0.01 to 0.3 µm deep.

Following formation by a generally anisotropic etch, the resulting trench is generally first lined with a thin thermal "liner" oxide and then filled with a deposited dielectric, such as a plasma enhanced oxide. As known in the art, deposited oxides generally have a higher etch rate as compared to the thermally grown oxides which are generally used as gate dielectrics. As a result, a wet etch (e.g. dilute HF deglaze) of a gate dielectric in the non-gate areas after trench formation generally results in a significant loss in trench dielectric thickness, with a larger loss (e.g. about 1.5 to 2 times) being at the peripheral edges of the trench isolation regions which etch at a higher rate as compared to the trench dielectric away from the peripheral edges. The trench edges thus become recessed, giving rise to what are commonly referred to as divots.

The divots in the trench isolation structures are undesirable as they increase the sub-threshold leakage current of FETs in the adjacent active semiconductor regions. This effect can be particularly significant for the low voltage regions having thin gate dielectric comprising FETs. In addition, as known in the art, relatively thick gate oxides (e.g. >300 Angstroms) grow non-uniformly being thicker away from the trench edge and being thinner (typically ≦75% of the thicker thickness) at or near the trench/active area edges/corners. This corner thinning results in processes targeting thick oxide to be thicker than otherwise necessary to avoid gate dielectric breakdown at the trench corner. Furthermore, sharpening at the trench corner can cause high stress levels that can result in crystal defects in the active area that can reduce circuit yield. Accordingly, it is desirable to provide a method for fabricating a multiple gate dielectric chip in which divot formation and corner sharpening at the trench corners is significantly reduced.

SUMMARY

This Summary is provided to comply with 37 C.F.R. §1.73, presenting a summary of the invention to briefly indicate the nature and substance of the invention. It is submitted with the understanding that it will not be used to interpret or limit the scope or meaning of the claims.

Embodiments of the present invention describe methods to integrate thick gate dielectrics (e.g., 200 to 2,000 Angstroms thick silicon oxide) in trench isolation-based process flows that include multiple (i.e., two or more) different gate dielectric thicknesses. The thick gate dielectric is formed before trench isolation formation. This is in contrast to conventional process flows which form the thick gate dielectric (e.g., oxide) after trench isolation. In such conventional processes, the trench etch is done through a single oxide thickness across the entire wafer. Since embodiments of the present invention form the thick gate dielectric before the trenches are formed, the trench corners for the thick oxide are generally protected and the gate electrode (e.g., polysilicon) deposited early in the process flow, thus further reducing the depth of the divots, and in some cases essentially eliminating the divots at the trench corners.

A first embodiment of the invention comprises a method of fabricating an integrated circuit (IC) comprising a first plurality of MOS transistors having a first gate dielectric having a first thickness in first regions of the substrate, and a second plurality of MOS transistors having a second gate dielectric having a second thickness in second regions of the substrate, wherein the first thickness is less than the second thickness. A substrate having semiconductor surface is provided. A pad dielectric layer having a thickness less than or equal to the second thickness is formed on the semiconductor surface including over the second regions, wherein the pad dielectric layer provides at least a portion of the second thickness for the second gate dielectric. A hard mask layer is formed on the semiconductor surface including over the second regions. A plurality of trench isolation regions is then formed by etching through the pad dielectric layer and a portion of the semiconductor surface. The trench isolation regions are filled with a dielectric fill material to form filled trench isolation regions, and the hard mask layer is then removed. A patterned gate electrode layer is formed over the second gate dielectric, wherein the patterned gate electrode layer extends over a surface of at least one of the filled trench isolation regions. Fabrication of the MOS transistors in the first and second regions is then completed.

ICs comprising a first plurality of MOS transistors having a first gate dielectric having a first thickness in first regions, and a second plurality of MOS transistors having a second gate dielectric having a second thickness in second regions, wherein the first thickness<said second thickness are also disclosed. The second thickness is generally 200 to 2,000 Angstroms. ICs according to embodiments of the invention have significantly reduced divot formation and corner sharpening at the trench corners. For example, the second thickness over the trench isolation active area edges are generally at least 90%, and generally at least 95%, of the second thickness away (e.g. 0.3 µm away) from the trench isolation active area edges.

DETAILED DESCRIPTION

Figure 1:
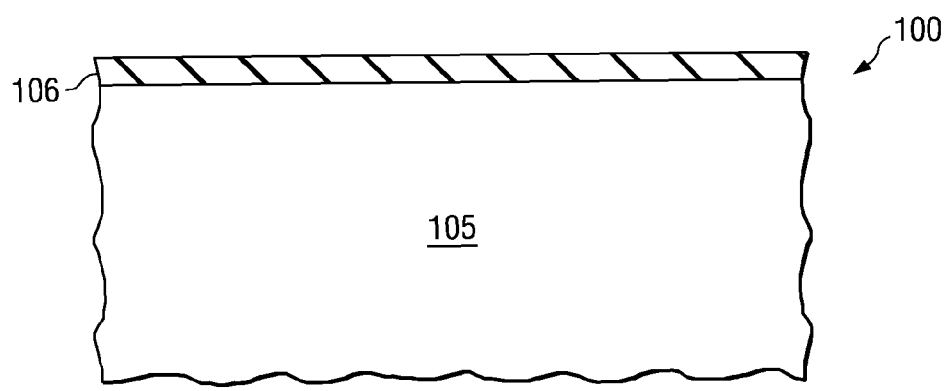
FIG. 1-6 are cross sectional views of a multiple gate dielectric thickness comprising device at various intermediate stages of fabrication, according to a first embodiment of the invention.

The present invention is described with reference to the attached figures, wherein like reference numerals are used throughout the figures to designate similar or equivalent elements. The figures are not drawn to scale and they are provided merely to illustrate the instant invention. Several aspects of the invention are described below with reference to example applications for illustration. It should be understood that numerous specific details, relationships, and methods are set forth to provide a full understanding of the invention. One having ordinary skill in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Embodiments of the invention describe methods for fabricating an integrated circuit (IC) having multiple (two or more) different gate dielectric thicknesses in a trench isolation process flow in which divot formation and corner sharpening are both significantly reduced or eliminated, and ICs fabricated therefrom. A first embodiment of the present invention is described with the aid of FIGS. 1-6 which are various cross-sections of a chip having multiple gate dielectric thicknesses at successive stages of manufacture.

FIG. 1 shows a cross sectional view of multiple gate dielectric thickness comprising device 100 at a first intermediate stage of fabrication, according to an embodiment of the invention. Device 100 is shown including a substrate 105 having a semiconductor surface 106, such as a Si or Si/Ge surface. The substrate 105 can comprise a conventional single crystal substrate or a SOI substrate.

Figure 2:
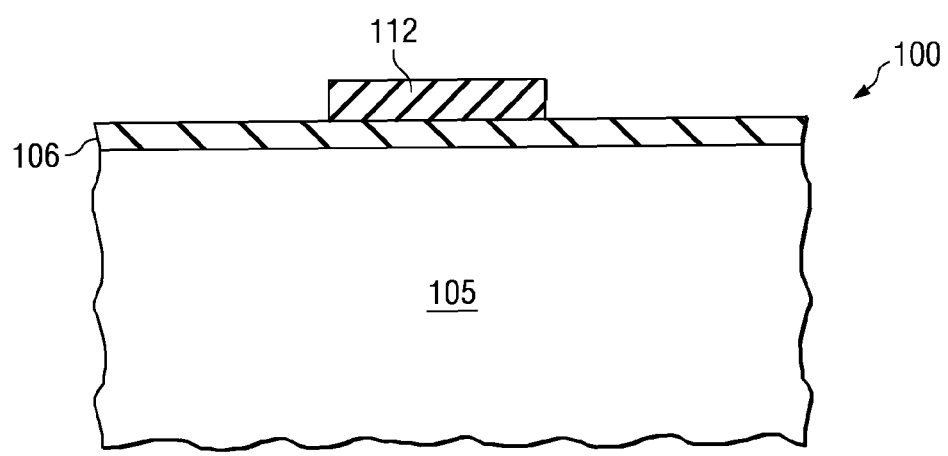

FIG. 2 shows a cross sectional view of the multiple gate dielectric thickness comprising device 100 at a later intermediate stage of fabrication, according to an embodiment of the invention, where a patterned thick oxide layer 112 which is used as a thick gate oxide layer, generally being 200 to 2,000 Angstroms thick is formed, such as, for example, 425-475 A of thermal oxide. A standard resist pattern and etch process can be used to define areas that require the thick oxide layer (e.g. where high voltage devices are needed), wherein the remainder of the thick oxide layer 112 is etched away.

Figure 3:
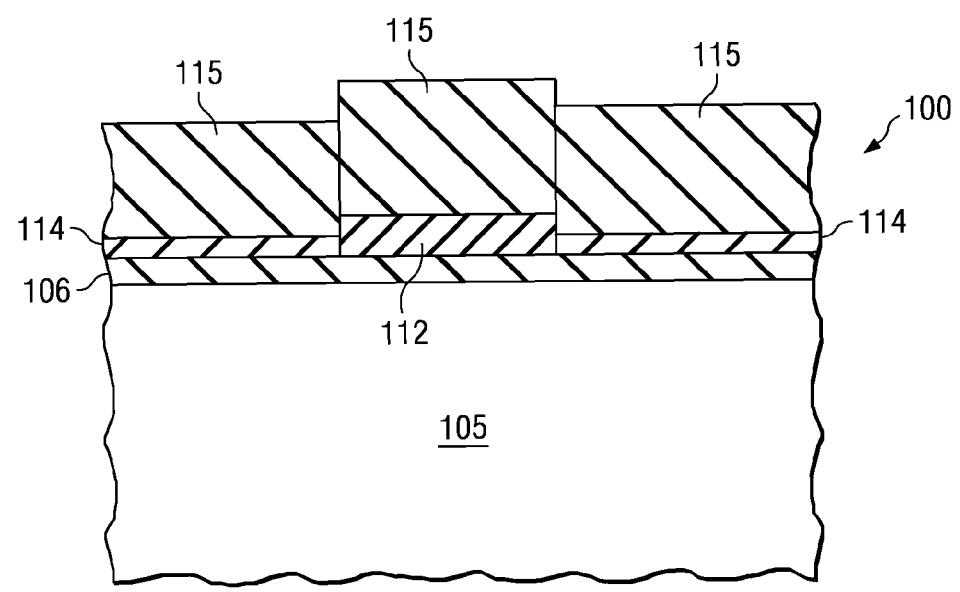

FIG. 3 shows a cross sectional view of the multiple gate dielectric thickness comprising device 100 at a later intermediate stage of fabrication, according to an embodiment of the invention. An intermediate dielectric thickness layer 114 which is used as a gate oxide layer having intermediate thickness, such as 50 to 200 Angstroms thick is formed, for example a 100 to 150 A thick thermal oxide. Assuming dielectric layer 114 is thermally grown, the oxide thickness of thick oxide layer 112 will increase, so that if initially 450 Angstroms thick, will grow to about 500 Angstroms. A hard mask layer 115, such as a silicon nitride, silicon oxynitride (SiON) or silicon carbide layer 115 is then deposited on layers 112 and 114. The hard mask layer 115 thickness can be about 1,500 to 3,000 Angstroms, such around 2,000 Angstroms.

Figure 4:
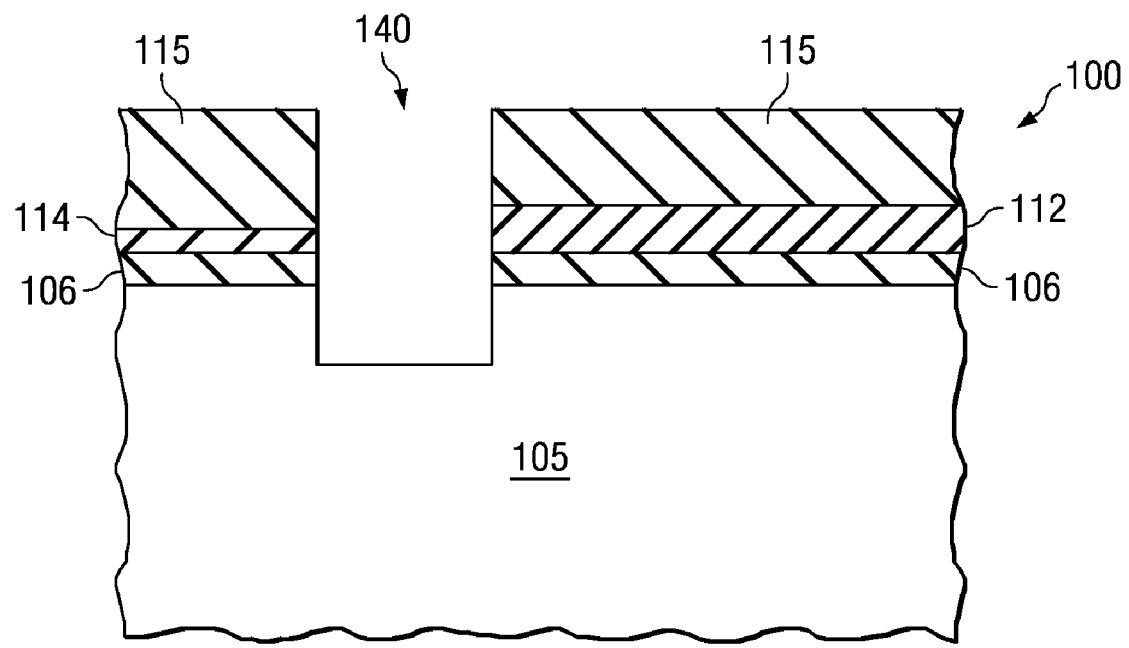

FIG. 4 shows a cross sectional view of the multiple gate dielectric thickness comprising device 100 at a later intermediate stage of fabrication, according to an embodiment of the invention, following trench isolation etch wherein trenches 140 in the substrate 105 are formed. The trench etch is generally modified to account for the thicker dielectric (e.g. thick oxide layer 112) in parts of device 100, as compared to a conventional process in which the thick gate oxide layer is formed after trench processing.

Although not shown, a liner oxide and liner anneal generally follow trench etch to condition the trench 140. In embodiments of the invention, nitride pullback processing as known in the art to recess the hard mask layer (e.g. nitride layer) 115 from the edges of trench 140 occurs next, occurring before trench fill. As known in the art, nitride pullback helps protect the trench edges/corners.

Figure 5:
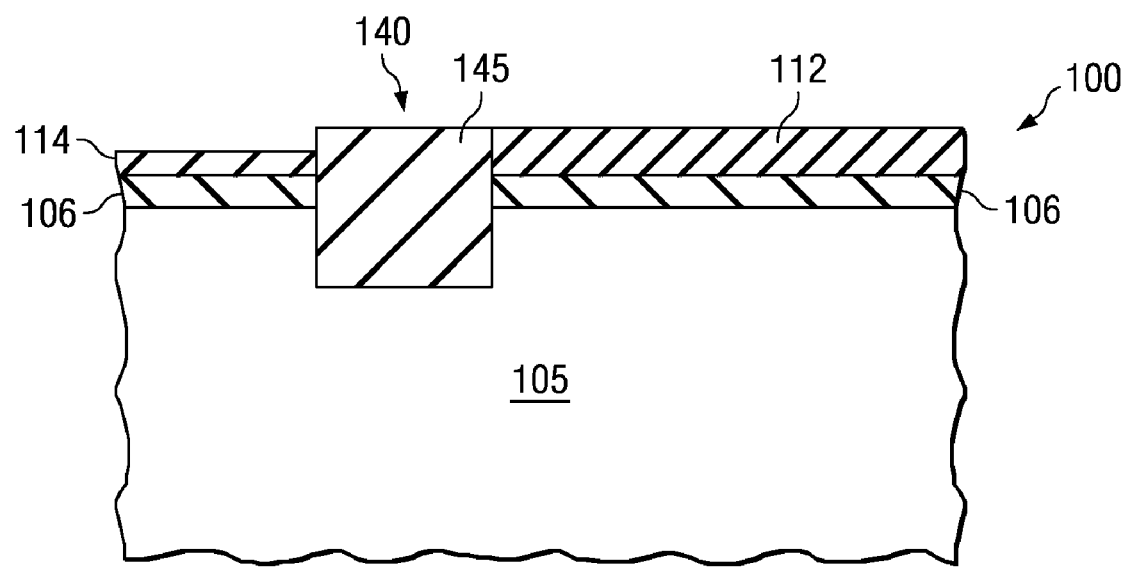

FIG. 5 shows a cross sectional view of the multiple gate dielectric thickness comprising device 100 at a later intermediate stage of fabrication, according to an embodiment of the invention, following trench fill with trench dielectric material 145, followed by chemical-mechanical polish (CMP) and then removal of hard mask layer (e.g. nitride) 115. Phosphoric acid can be used in the case of a nitride hardmask layer for removal.

An optional short prefurnace clean sufficient to remove native oxide (e.g. 10-20 A oxide removal with dilute HF) then can occur. Thereafter, although not shown, in another region of the device 100 a third gate dielectric thickness, the thinnest, such as about 15 to 50 A of a dielectric can be grown or deposited and/or annealed to form thin gate dielectric regions.

Figure 6:
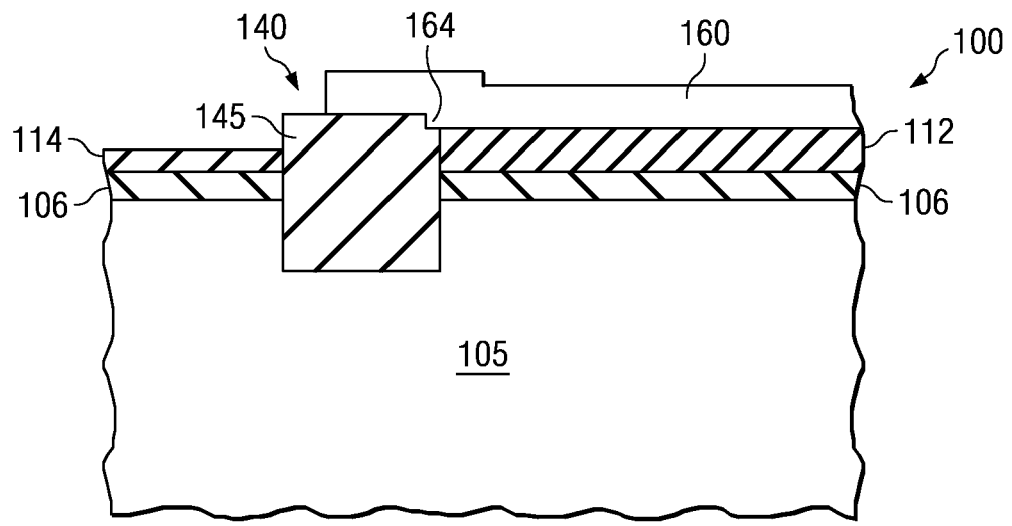

FIG. 6 shows a cross sectional view of the multiple gate dielectric thickness comprising device 100 at a later intermediate stage of fabrication, according to an embodiment of the invention, following gate electrode deposition, such as polysilicon deposition, and patterning and etching. In the embodiment described herein, polysilicon layer 160 is a dedicated poly level for the thick gate dielectric devices, with other devices, such as core and I/O devices which receive thinner gate dielectrics receiving their gate electrode (e.g. polysilicon) in a subsequent step. Being over the trench corner, polysilicon layer 160 protects the trench corner 164 against divoting for the balance of the processing of device 100, such as from deglazes. Fabrication of device 100 is then completed generally according to standard manufacturing procedures, such as the remainder of the front end of the line (FEOL), and the back end of the line (BEOL).

Figure 7:
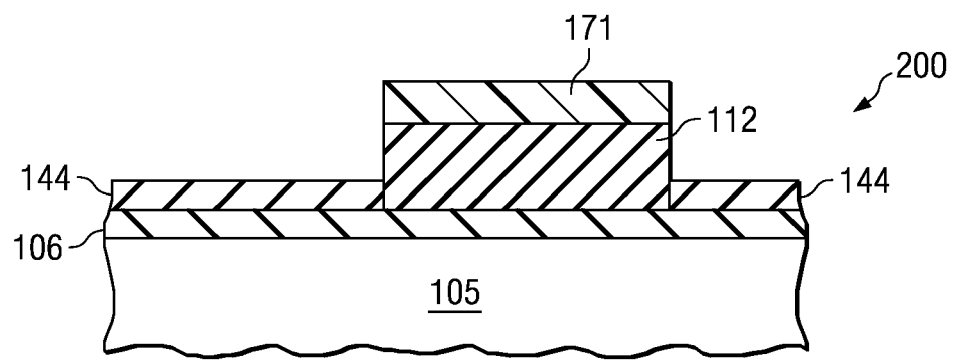
FIGS. 7-10 are cross sectional views of a multiple gate dielectric thickness comprising device at various intermediate stages of fabrication according to a second embodiment of the invention.
Figure 8:
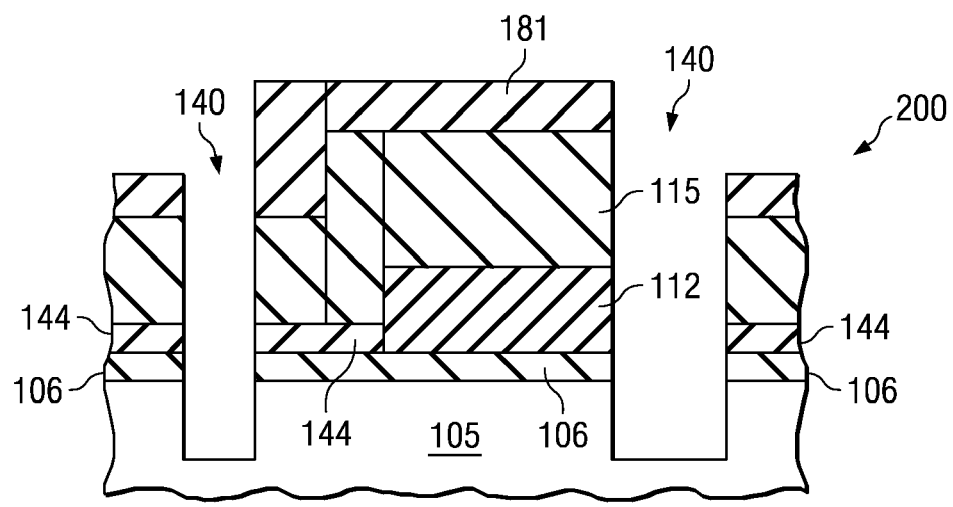
Figure 9:
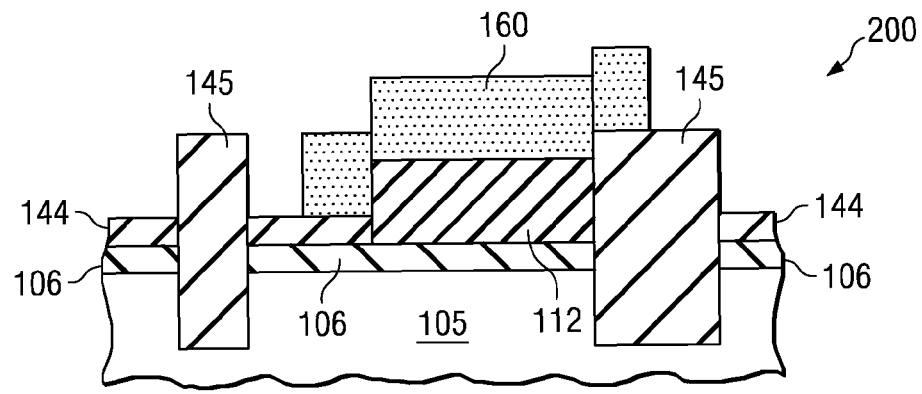
Figure 10:
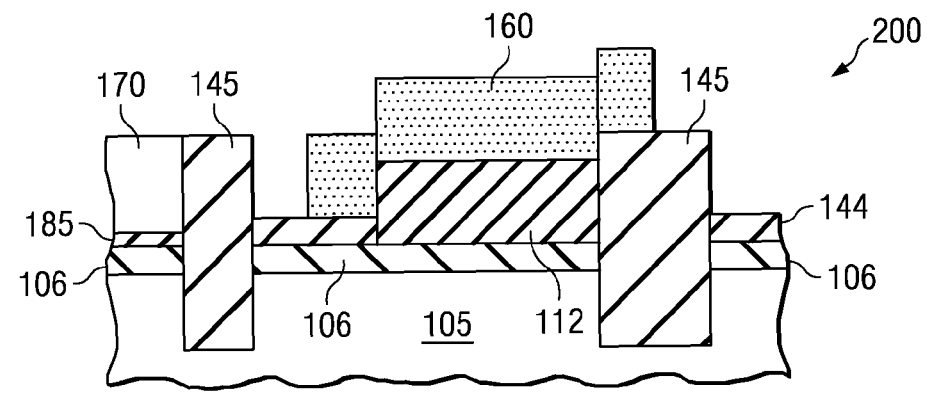

A second embodiment of the present invention is described with the aid of FIGS. 7-10 which are various cross-sections of a multiple gate dielectric thickness comprising device 200 at several intermediate stages of manufacture. FIG. 7 is a cross section depiction of a multiple gate dielectric thickness comprising device 200 after a thick oxide layer 112 of about 200 to 2,000 Angstroms (e.g. about 500 A) is grown on substrate 105, wherein the thick gate dielectric device areas are masked with a patterned masking layer 171 (e.g. with photoresist), and areas other than the thick gate dielectric device areas etched (e.g. deglazed) to a lower thickness shown as regions 144, such as to a thickness of 50 to 200 Angstroms. Following removal of masking layer 171, hard mask layer 115 is deposited, and patterned using masking layer 181, and trenches 140 are formed using the pattern to result in the intermediate structure of device 200 shown in FIG. 8.

The trench etch process is modified slightly to permit etching through the full thickness of thick oxide layer 112. Following removal of masking material 181 and trench filling with trench dielectric material 145, hard mask layer 115 is removed, and a dedicated polysilicon layer 160 is patterned and etched to result in the structure shown in FIG. 9. The thick gate dielectric device areas are patterned generally with a resist, oxide layer 144 is removed, and a gate oxide 185 for certain intermediate voltage devices, such as I/O devices is grown, such as 50 to 200 Angstroms thick. Subsequent steps parallel those above relative to device 100 including formation of a third gate dielectric thickness, the thinnest, such as about 15 to 50 A of a dielectric can be grown or deposited and/or annealed to form a thin gate dielectric, followed by gate electrode formation for these devices 170 (e.g. polysilicon) to result in the structure shown in FIG. 10.

Figure 11:
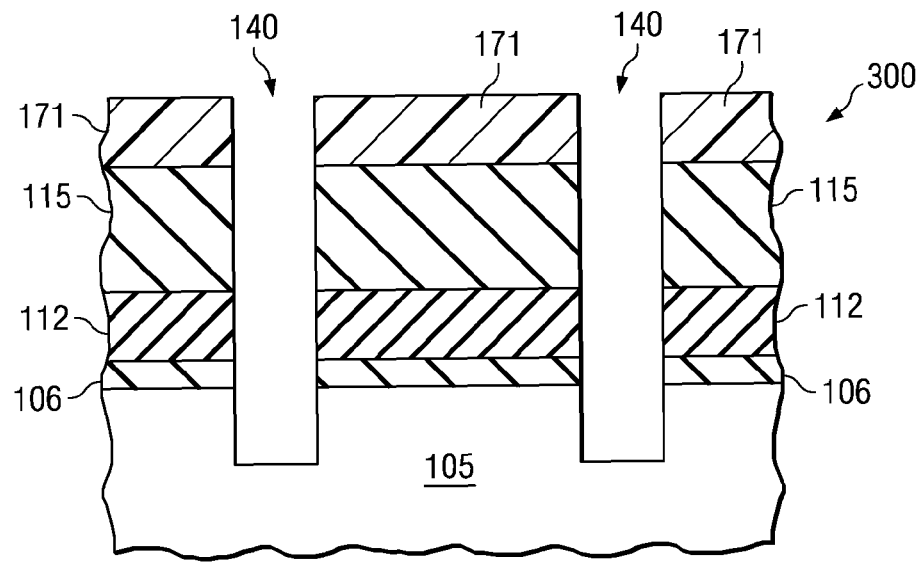
FIGS. 11-12 are cross sectional views of a multiple gate dielectric thickness comprising device at various intermediate stages of fabrication according to a third embodiment of the invention.
Figure 12:
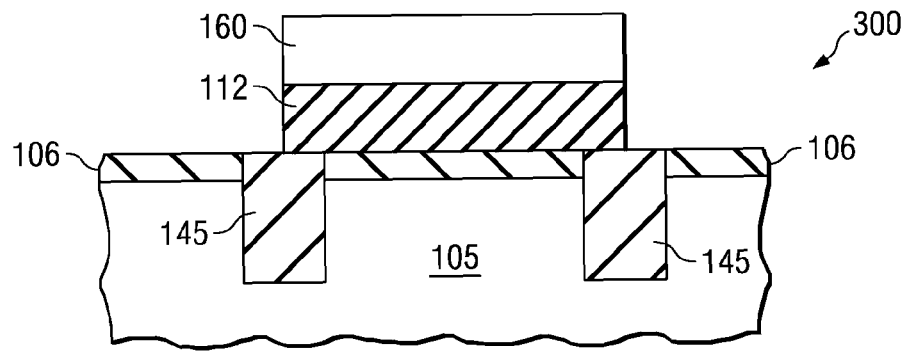

A third embodiment of the present invention is described with the aid of FIGS. 11-12 which are various cross-sections of a multiple gate dielectric thickness comprising chip 300 at several intermediate stages of manufacture. FIG. 11 is a cross section depiction of a multiple gate dielectric thickness comprising device 300 showing device 300 after formation of trenches 140 using a patterned stack comprising resist 171, on hard mask 115 on a grown or deposited pad oxide 112 which is used for the trench isolation processing and as the gate dielectric for the high voltage devices. FIG. 12 is a cross section depiction of the multiple gate dielectric thickness comprising device 300 after trench formation, hard mask layer 115 strip, and dedicated gate electrode layer 160 deposition, patterning and etching, and the dielectric (e.g. oxide) removed from the etched regions. Subsequent steps parallel those above relative to devices 100 and 200 including formation of a third gate dielectric thickness, the thinnest, such as about 15 to 50 A of a dielectric can be grown or deposited and/or annealed to form thin gate dielectric, followed by gate electrode formation for these devices.

As another processing alternative, the standard polysilicon deposition can be used to cover both the core, IO and HV-GOX layers. This alternative comprises use of a single polysilicon layer that is deposited after all the gate oxides are formed.

Figure 13:
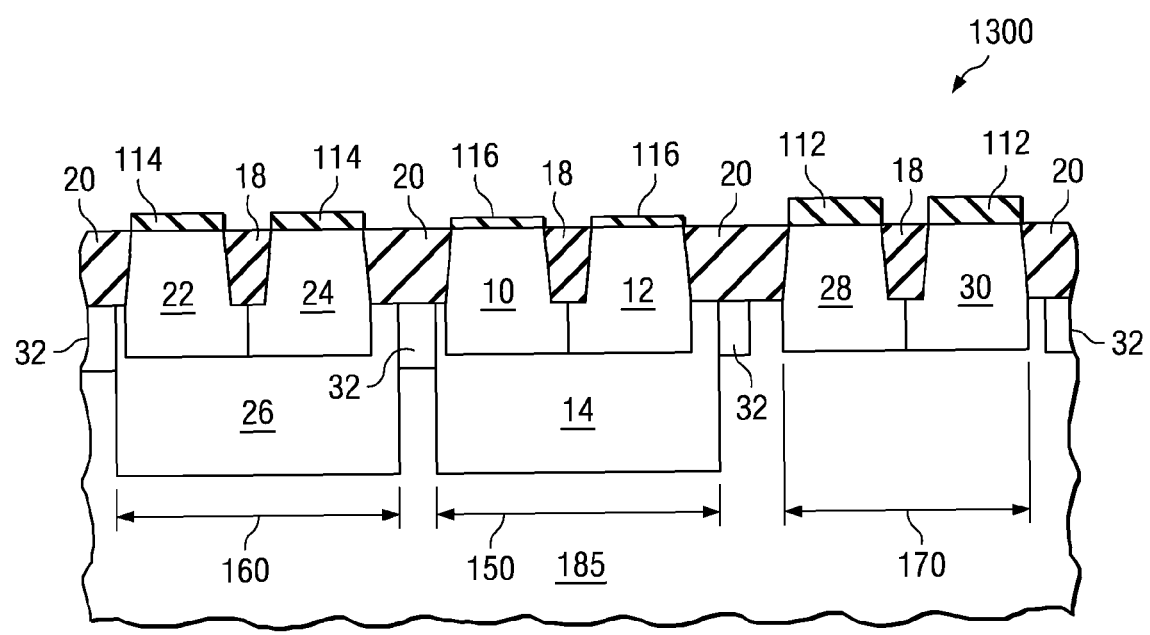
FIG. 13 is a simplified cross sectional view of a triple gate dielectric (TGD) device according to another embodiment of the invention.

FIG. 13 is a simplified cross sectional view of a TGD device 1300 according to an embodiment of the invention. TGD chip 1300 includes a p-substrate 185 having semiconductor regions of the first kind 150, semiconductor regions of the second kind 160, and semiconductor regions of the third kind 170 formed therein. Semiconductor regions of the first kind 150 are generally low voltage regions over which devices with thin gate dielectrics 116 are formed, semiconductor regions of the second kind 160 are intermediate voltage regions over which devices with gate dielectrics of intermediate thickness 114 are formed and semiconductor regions of the third kind 170 are high voltage regions over which devices with thick gate dielectrics 112 are formed. Correspondingly, there is a low gate breakdown voltage for MOSFETs in semiconductor regions of the first kind, an intermediate gate breakdown voltage for MOSFETs in semiconductor regions of the second kind and a high gate breakdown voltage for MOSFETs in semiconductor regions of the third kind. Gate electrodes are not shown.

In the semiconductor regions of the first kind 150 there is an n-well 10 and a p-well 12, which are formed in a deep n-well 14 that is formed in substrate 185. An isolation region, 18, which is generally an STI region, separates the n-well 10 from the p-well 12. It can be seen the edge of the isolation region 18 does not have any noticeable divot, whether in regions of the first kind 150, regions of the second kind 160, or regions of the third kind 170. ICs according to embodiments of the invention have significantly reduced divot formation and corner sharpening at the trench corners. For example, the thickness of dielectric layer 112 in regions of the third kind 170 over the trench isolation active area edges are generally at least 90%, and generally at least 95%, of the thickness of dielectric layer 112 a distance of 0.3 μm away from the trench isolation active area edges.

FIG. 13 depicts examples of what could constitute semiconductor regions of the first kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

Semiconductor regions of the second kind 160 includes an n-well 22 and a p-well 24, which are formed in a deep n-well 26 that is formed in a p-substrate 185. An isolation region, 18, which is generally an STI region, separates the n-well 22 from the p-well 24. FIG. 13 depicts examples of what could constitute semiconductor regions of the second kind, which could contain any number of n-type or p-type semiconductor regions. The semiconductor regions can be any kind of semiconductor region and not necessarily wells. The semiconductor regions need not be formed in a deep n-well that is formed in a p-substrate, but could for example be formed in a deep p-well that is formed in an n-substrate.

In the same way, semiconductor regions of the third kind 170 includes an n-well 28 and a p-well 30, which are formed in substrate 185. An isolation region, 18, which is generally an STI region, separates the n-well 28 from the p-well 30. FIG. 13 depicts examples of what could constitute semiconductor regions of the third kind, which could contain any number of n-type or p-type semiconductor regions. The semiconductor regions can be any kind of semiconductor region and not necessarily wells and they could be formed in an n-substrate.

Isolation regions 20 are shown in FIG. 13 separating regions of different kinds 150, 160 and 170. These isolation regions can be trench isolation regions that are disposed over field implant regions 32, which can be added as known in the art to enhance the isolation.

Embodiments of the invention can be integrated into a variety of process flows to form a variety of devices and related products that generally require high voltage MOS devices, which provide gate to body breakdown voltages of ≧10 volts. For example, the high voltage devices can be embodied as conventional CMOS devices, DEMOS or LDMOS. Exemplary devices include power management devices, display drivers and medical applications (e.g. defibrillators).

The semiconductor substrates may include various elements therein and/or layers thereon. These can include barrier layers, other dielectric layers, device structures, active elements and passive elements including source regions, drain regions, bit lines, bases, emitters, collectors, conductive lines, conductive vias, etc. Moreover, the invention can be used in a variety of processes including bipolar, CMOS, BiCMOS and MEMS.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

The terminology used herein is for the purpose of describing particular embodiments only and is not intended to be limiting of the invention. As used herein, the singular forms "a", "an" and "the" are intended to include the plural forms as well, unless the context clearly indicates otherwise. Furthermore, to the extent that the terms "including", "includes", "having", "has", "with", or variants thereof are used in either the detailed description and/or the claims, such terms are intended to be inclusive in a manner similar to the term "comprising."

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the following claims.

What is claimed is:

1. A method of fabricating an integrated circuit, comprising:
    forming a first layer of dielectric material of a first thickness over a first type MOS transistor region of a semiconductor substrate;
    forming a second layer of dielectric material of a second thickness less than the first thickness over a second type MOS transistor region of the semiconductor substrate and over the first type MOS transistor region;
    forming a patterned hard mask over the first and second layers of dielectric material over the first type MOS transistor region and over the second layer of dielectric material over the second type MOS transistor region;
    selectively etching the first and second layers of dielectric material through the patterned hard mask layer to form an isolation trench in the semiconductor substrate to isolate the first and second type MOS transistor regions;
    filling the isolation trench with trench isolation material;
    removing the hard mask;
    forming a patterned gate electrode over the first and second layers of dielectric material over the first type MOS transistor region and over an adjacent corner part of the isolation trench filled with trench isolation material; and
    after forming the patterned gate electrode, selectively etching a portion of at least one of the first or second layers of dielectric material not covered by the patterned gate electrode, the patterned gate electrode protecting the adjacent corner part of the filled isolation trench from the etching.

2. A method of fabricating an integrated circuit, comprising:
    forming dielectric material over a first type MOS transistor region and over a second type MOS transistor region of a semiconductor substrate, the dielectric material being formed to a greater thickness over the first type MOS transistor region than over the second type MOS transistor region;
    forming a patterned mask over the dielectric material formed over the first and second type MOS transistor regions;
    selectively etching the dielectric material through the patterned mask to form an isolation trench in the semiconductor substrate to isolate the first and second type MOS transistor regions;
    filling the isolation trench with trench isolation material;
    removing the mask;
    forming a patterned gate electrode to cover the greater thickness of the dielectric material over the first type MOS transistor region and to cover an adjacent corner part of the isolation trench filled with trench isolation material; and
    after forming the patterned gate electrode, selectively etching at least a portion of dielectric material not covered by the patterned gate electrode, the patterned gate electrode protecting the adjacent corner part of the filled isolation trench from the etching.

3. The method of claim 2, wherein at least part of the dielectric material is thermally grown and the greater thickness is greater than 200 Angstroms.

4. The method of claim 2, wherein the patterned mask comprises at least one of silicon nitride (SiN), silicon oxynitride (SiON) or silicon carbide (SiC).

5. The method of claim 2, wherein the patterned gate electrode comprises polysilicon.

6. The method of claim 5, wherein the patterned gate electrode is formed from a dedicated gate electrode layer that is patterned to provide the patterned gate electrode over the first type MOS transistor region, but not over the second type MOS transistor region.

7. The method of claim 2, wherein forming the dielectric material comprises forming a first dielectric layer to a first thickness over the first and second type MOS transistor regions; forming a resist pattern over the first dielectric layer; and selectively etching the first dielectric layer using the resist pattern to remove all of the first dielectric layer from over the second type MOS transistor region.

8. The method of claim 7, wherein forming the dielectric material further comprises thermally growing a second dielectric layer to a second thickness less than the first thickness after selectively etching the first dielectric layer; wherein the second dielectric layer provides the second thickness of the dielectric material over the second type MOS transistor region, and provides the second thickness to the first thickness of the first dielectric layer as part of the greater thickness of the dielectric material over the first type MOS transistor region.

9. The method of claim 2, wherein forming the patterned mask comprises forming a hard mask; and further comprising performing a hard mask pullback process to recess the hard mask from edges of the formed isolation trench before filling the isolation trench with trench isolation material.

10. The method of claim 2, further comprising forming dielectric material over a third type MOS transistor region of the semiconductor substrate, the dielectric material being formed to lesser thickness over the third type MOS transistor region than over the second type MOS transistor region.

11. The method of claim 2, wherein the dielectric material is formed to a thickness greater than 400 Angstroms over the first type MOS transistor region; and the dielectric material is formed to a thickness no greater than 200 Angstroms over the second type MOS transistor region.

12. The method of claim 11, wherein the patterned mask is a patterned hard mask comprising at least one of silicon nitride (SiN), silicon oxynitride (SiON) or silicon carbide (SiC).

13. The method of claim 12, wherein the patterned gate electrode comprises polysilicon.

14. The method of claim 13, further comprising performing a hard mask pullback process to recess the hard mask from edges of the formed isolation trench before filling the isolation trench with trench isolation material.

* * * * *